(12) United States Patent
Ko

(10) Patent No.: US 7,944,002 B2
(45) Date of Patent: May 17, 2011

(54) SEMICONDUCTOR DEVICE AND METHOD FOR FABRICATING THE SAME

(75) Inventor: Choul-Joo Ko, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 253 days.

(21) Appl. No.: 12/248,141

(22) Filed: Oct. 9, 2008

(65) Prior Publication Data
US 2009/0166763 A1 Jul. 2, 2009

(30) Foreign Application Priority Data

Dec. 27, 2007 (KR) .................. 10-2007-0138544

(51) Int. Cl.
*H01L 29/78* (2006.01)
(52) U.S. Cl. .................. 257/401; 257/E29.259
(58) Field of Classification Search .................. 257/401, 257/E29.259
See application file for complete search history.

(56) References Cited

U.S. PATENT DOCUMENTS

| | | | |
|---|---|---|---|
| 4,290,078 A | | 9/1981 | Ronen |
| 4,561,168 A * | | 12/1985 | Pitzer et al. .................. 438/274 |
| 6,818,950 B1 * | | 11/2004 | Mallikarjunaswamy ..... 257/340 |
| 6,946,335 B1 | | 9/2005 | Ip et al. |
| 7,485,924 B2 * | | 2/2009 | Takimoto et al. ............. 257/339 |
| 7,554,154 B2 * | | 6/2009 | Hebert .......................... 257/340 |
| 7,625,787 B2 * | | 12/2009 | Lee et al. ...................... 438/157 |
| 7,768,067 B2 * | | 8/2010 | Otake et al. ................... 257/335 |
| 2002/0008282 A1 * | | 1/2002 | Kubo et al. .................... 257/341 |
| 2007/0069308 A1 * | | 3/2007 | Ko ................................ 257/401 |
| 2007/0138551 A1 | | 6/2007 | Ko |
| 2008/0150016 A1 * | | 6/2008 | Ko ................................ 257/330 |

FOREIGN PATENT DOCUMENTS

| | | |
|---|---|---|
| CN | 101207125 | 6/2008 |
| KR | 100649867 | 11/2006 |

OTHER PUBLICATIONS

Chinese Office Action dated Apr. 2, 2010 and English translation thereof.

* cited by examiner

*Primary Examiner* — Allan R Wilson
(74) *Attorney, Agent, or Firm* — Sherr & Vaughn, PLLC

(57) ABSTRACT

Embodiments relate to a semiconductor device having a minimized on-resistance. According to embodiments, a semiconductor device may include at least one of the following: a first conductive type well formed on and/or over a semiconductor substrate, a second conductive type body region formed within the first conductive type well a first conductive type source region formed on and/or over the surface of the body region, a first conductive type drain region formed on and/or over the surface of the first conductive type well. Further, according to embodiments, a semiconductor device may include a field insulation layer positioned between the first conductive type source region and the first conductive type drain region and a gate electrode formed on and/or over the field insulation layer. The source region may be formed at a lower position than the drain region.

6 Claims, 2 Drawing Sheets

SEMICONDUCTOR DEVICE AND METHOD FOR FABRICATING THE SAME

Figure 1:
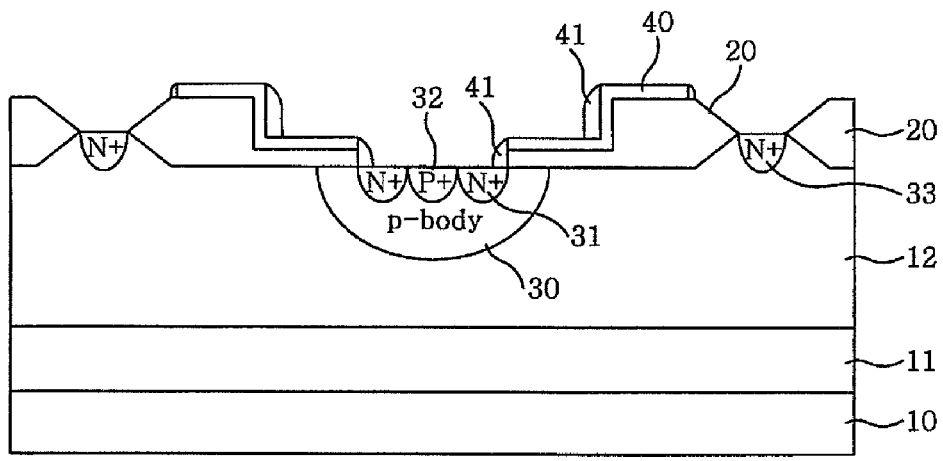
Figure 2:
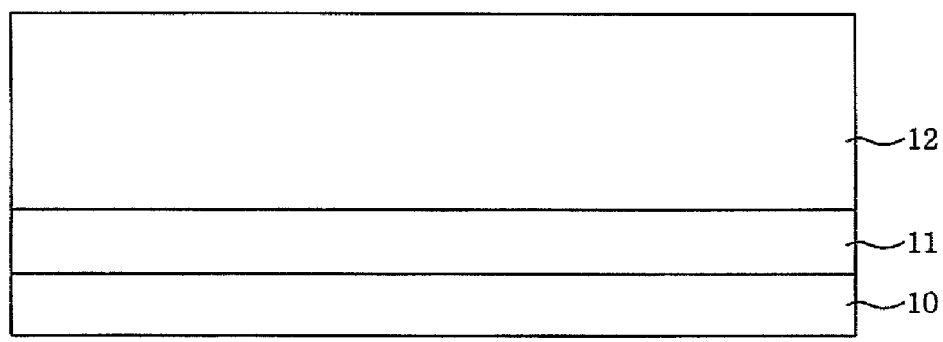

The present application claims priority under 35 U.S.C. 119 to Korean Patent Application No. 10-2007-0138544 (filed on Dec. 27, 2007), which is hereby incorporated by reference in its entirety.

BACKGROUND

A semiconductor device for a power supply should preferably operate at a relatively high voltage, for example near a theoretical breakdown voltage. When an external device operating at a high voltage is controlled by an integrated circuit, a high-voltage control element may be required in the integrated circuit, and should be built to have a high breakdown voltage. Hence, when high voltage is applied directly to a drain or source of a transistor, a punch through voltage between the drain/source and a semiconductor substrate and a breakdown voltage between the drain/source and a well or a substrate may need to be greater than the high voltage.

Among various high-voltage semiconductor devices, a lateral diffused MOS (LDMOS) device, which may be one type of high-voltage MOS devices, may have a structure suitable for high voltages. A LDMOS may use a drift region to separate a channel region from a drain electrode, and may be controlled by a gate electrode.

A related art LDMOS device may have a source region and a drain region formed to have substantially equal heights on and/or over a semiconductor substrate. In addition, a Local Oxidation of Silicon (LOCOS) insulation film may be provided between the source region and the drain region.

Because a LOCOS insulation film may be formed at a certain depth in the semiconductor substrate, electrons traveling from a source region via a channel region may go under the LOCOS insulation film and move toward the drain region. Accordingly, in such a related art LDMOS device, a distance electrons need to travel may be relatively long, which may increase an on-resistance (Ron).

SUMMARY

Embodiments relate to a semiconductor device and a method for manufacturing a semiconductor device. Embodiments may also relate to a semiconductor device with a minimized on-resistance, and a method for manufacturing the same.

According to embodiments, a semiconductor device may include at least one of the following elements. A first conductive type well formed on and/or over a semiconductor substrate. A second conductive type body region formed within the first conductive type well. A first conductive type source region formed on and/or over the surface of the body region. A first conductive type drain region formed on and/or over the surface of a first conductive type well. A field insulation layer arranged between the first conductive type source region and the first conductive type drain region. A gate electrode formed on and/or over the field insulation layer. The first conductive type source region may be formed at a lower position than the first conductive type drain region.

According to embodiments, a method for manufacturing a semiconductor device may include at least one of the following. Forming a first conductive type well on and/or over a semiconductor substrate. Forming a field insulation layer on and/or over the semiconductor substrate where the first conductive type well is formed. Selectively etching the field insulation layer. Implanting first conductive type dopant ions into one side of the field insulation layer to form a drain region. Implanting the first conductive type dopant ions and second conductive type dopant ions through the selectively etched field insulation layer to form a second conductive type body region underneath and/or below the selectively etched field insulation layer and to form a first conductive type source region on and/or over a surface of the second conductive type body region. Forming a gate electrode on and/or over the field insulation layer and removing the field insulation layer on and/or over the second conductive type body region.

DRAWINGS

Example FIG. 1 illustrates a cross-sectional view illustrating a semiconductor device according to embodiments.

Example FIGS. 2-6 illustrate cross-sectional views illustrating a method of manufacturing a semiconductor device according to embodiments.

DESCRIPTION

Example FIG. 1 illustrates a cross-sectional view illustrating a semiconductor device according to embodiments. Referring to example FIG. 1, first conductive type buried layer 11 and first conductive type well 12 may be formed on and/or over a semiconductor substrate 10. Second conductive type P-body region 30 may be formed within an upper portion of first conductive type well 12. According to embodiments, first conductive type buried layer 11 may be formed by implanting a dopant. According to embodiments, an insulation material, such as a buffer oxide film, may be filled instead of first conductive type buried layer 11. First conductive type source region 31 and second conductive type source contact region 32 may be formed on and/or over P-body region 30. Field insulation layer 20 may be formed at one side of first conductive type source region 31, and drain region 33 may be formed at one side of field insulation layer 20.

According to embodiments, field insulation layer 20 may be formed by an LOCOS process or by a Shallow Trench Isolation (STI) process. For purposes of example and convenience, an oxide film formed by an LOCOS process will be considered. Gate electrode 40 may be formed on and/or over field insulation layer 20. Spacer 41 may be formed at a side wall of gate electrode 40. According to embodiments, field insulation layer 20 may serve as a gate insulation film for gate electrode 40. However, according to embodiments, field insulation layer 20 may be eliminated completely and a separate gate insulation film may be formed. According to embodiments, field insulation layer 20 may be selectively removed substantially in a trench shape. Source region 31, source contact region 32, and P-body region 30 may be formed underneath and/or below the trench formed in field insulation layer 20. According to embodiments, gate electrode 40 may be formed on and/or over a portion where field insulation layer 20 may have been selectively removed and on and/or over a portion where field insulation layer 20 remains. Source region 31 may be formed at substantially the same position as the lower side of field insulation layer 20 or below it. According to embodiments, source region 31 may be formed at a lower position than a position of drain region 33. Electrons emitted from source region 31 may therefore move in a substantially horizontal direction and a substantially upward direction, and may flow toward drain region 33.

Since a travel path of electrons of a semiconductor device according to embodiments may be relatively shorter than that of the related art LDMOS device, on-resistance may be minimized. Moreover, it may not be necessary that field insulation layer 20 be relatively thinner than that of the related art LDMOS device. Hence, a breakdown voltage may be similar to that of the related art LDMOS device.

Example FIGS. 2-6 are cross-sectional views illustrating a method of manufacturing a semiconductor device according to embodiments. Referring to example FIG. 2, according to embodiments, first conductive type dopant ions may be implanted on and/or over semiconductor substrate 10, and may form first conductive type buried layer 11 and first conductive type well 12. According to embodiments, first conductive type dopant may be an N-type dopant or a P-type dopant. For purposes of example, an N-type dopant is described.

Figure 3:
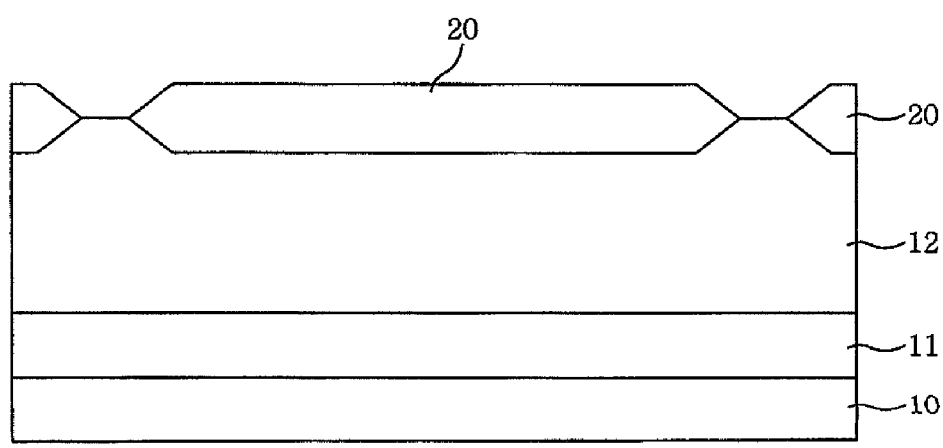

Referring to example FIG. 3, field insulation layer 20 may be selectively formed on and/or over semiconductor substrate 10. According to embodiments, field insulation layer 20 may be formed by a LOCOS process or a STI process. According to embodiments, an oxide film formed by a LOCOS process may be used as field insulation layer 20.

Figure 4:
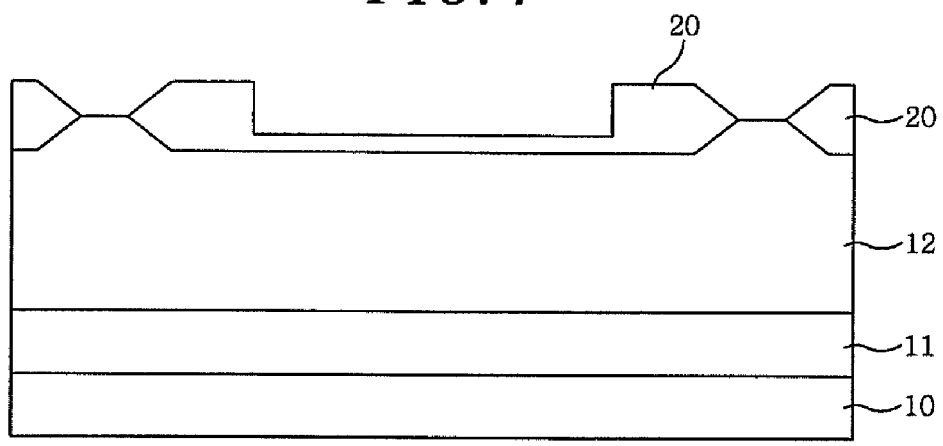

Referring to example FIG. 4, part of field insulation layer 20 may be selectively etched substantially in a trench pattern. According to embodiments, etched field insulation layer 20 may be formed to have a relatively small thickness relative to unetched portions, and may be formed on and/or over the semiconductor device 10.

Figure 5:
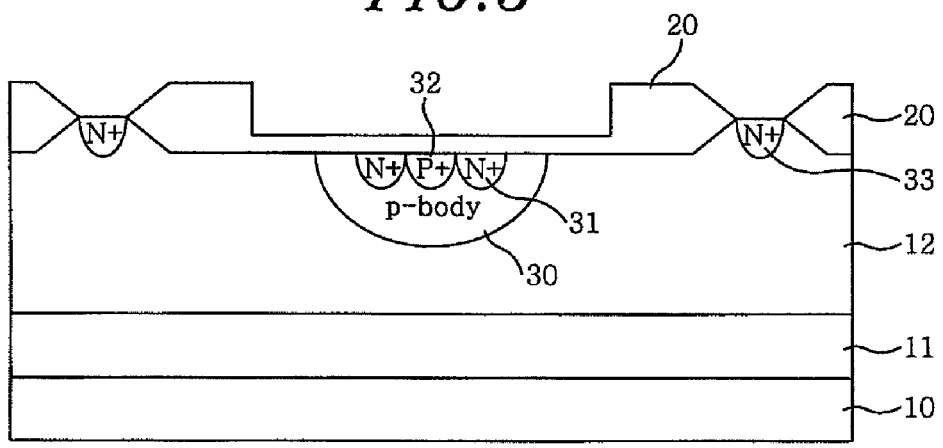

Referring to example FIG. 5, first conductive type dopant ions may be implanted between field insulation layers 20, and may form drain region 33. According to embodiments, first conductive type dopant ions and second conductive type dopant ions may be implanted underneath and/or below field insulation layer 20 etched in the trench pattern. This may form P-body region 30, first conductive type source region 31, and second conductive type source contact region 32, according to embodiments.

Figure 6:
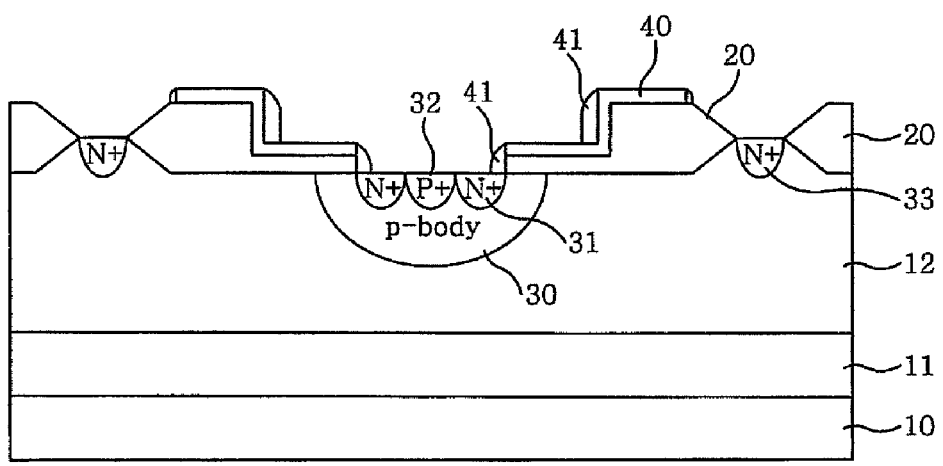

Referring to example FIG. 6, polysilicon may be deposited and patterned on and/or over field insulation layer 20, and may form gate electrode 40. According to embodiments, at least a portion of field insulation layer 20, which may be thin and etched in a trench pattern, may be removed after gate electrode 40 is etched and patterned. Spacer 41 may be formed at a side wall of gate electrode 40. According to embodiments, contacts may be formed in source region 31, source contact region 32, and drain region 33. This may be achieved using a silicide process. According to embodiments, on-resistance may minimized for a semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device, comprising:
a first conductive type well formed over a semiconductor substrate;
a second conductive type body region formed within the first conductive type well;
a first conductive type source region formed over a surface of the second conductive type body region;
a first conductive type drain region formed over a surface of the first conductive type well;
a field insulation layer formed between the first conductive type source region and the first conductive type drain region and having a first portion of a first thickness and a second portion of a second thickness, the second thickness being less than the first thickness; and
a gate electrode formed on top surfaces of the first and second portions of the field insulation layer,
wherein the first conductive type source region is formed at a position lower than a position of the first conductive type drain region.

2. The device of claim 1, wherein a height position of a top surface of the source region is substantially the same as a height position of a bottom surface of the field insulation layer.

3. The device of claim 2, wherein a top surface of the drain region is positioned higher than a top surface of the source region.

4. The device of claim 1, comprising a second conductive type source contact region formed at one side of the first conductive type source region relative to the semiconductor substrate.

5. The device of claim 4, wherein the second conductive type source contact region is made of silicide.

6. The device of claim 1, wherein a first conductive type buried layer is formed below the first conductive type well.

* * * * *